US011060702B2

(12) United States Patent
Meir et al.

(10) Patent No.: US 11,060,702 B2
(45) Date of Patent: Jul. 13, 2021

(54) LIGHTING SYSTEM WITH LENS ASSEMBLY

(71) Applicant: Ecosense Lighting Inc., Los Angeles, CA (US)

(72) Inventors: Ariel Meir, Brooklyn, NY (US); Noam Meir, Herzliya (IL); Rina Meir, Brooklyn, NY (US)

(73) Assignee: ECOSENSE LIGHTING INC., Los Angeles, CA (US)

( * ) Notice: Subject to any disclaimer, the term of this patent is extended or adjusted under 35 U.S.C. 154(b) by 0 days.

(21) Appl. No.: 15/453,848

(22) Filed: Mar. 8, 2017

(65) Prior Publication Data

US 2017/0261187 A1 Sep. 14, 2017

Related U.S. Application Data

(60) Provisional application No. 62/405,446, filed on Oct. 7, 2016, provisional application No. 62/405,456, filed (Continued)

(51) Int. Cl.
F21V 7/28 (2018.01)
F21V 17/04 (2006.01)
(Continued)

(52) U.S. Cl.
CPC ............... F21V 17/04 (2013.01); F21S 8/04 (2013.01); F21V 7/0091 (2013.01); F21V 7/041 (2013.01);
(Continued)

(58) Field of Classification Search
CPC ... F21S 4/20–26; F21V 5/048; F21K 9/60–69
See application file for complete search history.

(56) References Cited

U.S. PATENT DOCUMENTS 4,445,164 A 4/1984 Giles, III et al.
4,580,859 A 4/1986 Frano et al.
(Continued)

FOREIGN PATENT DOCUMENTS

CA 2623604 A 8/2009
CN 101592291 A 12/2009
(Continued)

OTHER PUBLICATIONS

International Search Report and Written Opinion dated Nov. 27, 2013 in PCT Application No. PCT/US2013/045708.
(Continued)

Primary Examiner — Sean P Gramling
(74) Attorney, Agent, or Firm — Jay M. Brown

(57) ABSTRACT

According to at least one aspect, a lighting device is provided. The lighting device comprises a circuit board, an LED mounted to the circuit board that is configured to emit light with an angular CCT deviation, a lens assembly mounted to the circuit board over the LED and configured to receive the light emitted from the LED and reduce the angular CCT deviation of the light received from the LED to make a color temperature of the light received from the LED more uniform, and an elastomer encapsulating at least part of the circuit board that is separate and distinct from the lens assembly.

14 Claims, 12 Drawing Sheets

Related U.S. Application Data on Oct. 7, 2016, provisional application No. 62/405,463, filed on Oct. 7, 2016, provisional application No. 62/405,468, filed on Oct. 7, 2016, provisional application No. 62/405,472, filed on Oct. 7, 2016, provisional application No. 62/305,386, filed on Mar. 8, 2016.

(51) Int. Cl.

| | | |
|---|---|---|
| *F21S 8/04* | (2006.01) | |
| *H01L 33/58* | (2010.01) | |
| *H01L 33/60* | (2010.01) | |
| *H01L 33/50* | (2010.01) | |
| *H05K 1/18* | (2006.01) | |
| *H05K 1/02* | (2006.01) | |
| *H05K 3/28* | (2006.01) | |
| *G02B 19/00* | (2006.01) | |
| *F21V 7/00* | (2006.01) | |
| *F21V 7/04* | (2006.01) | |
| *G02B 27/30* | (2006.01) | |
| *F21Y 115/10* | (2016.01) | |
| *F21S 8/00* | (2006.01) | |
| *F21V 13/04* | (2006.01) | |
| *F21W 131/10* | (2006.01) | |
| *F21Y 103/10* | (2016.01) | |

(52) U.S. Cl.
 CPC ............ *F21V 7/28* (2018.02); *G02B 19/0061* (2013.01); *G02B 27/30* (2013.01); *H01L 33/502* (2013.01); *H01L 33/58* (2013.01); *H01L 33/60* (2013.01); *H05K 1/0274* (2013.01); *H05K 1/189* (2013.01); *H05K 3/284* (2013.01); *F21S 8/033* (2013.01); *F21V 13/04* (2013.01); *F21W 2131/10* (2013.01); *F21Y 2103/10* (2016.08); *F21Y 2115/10* (2016.08); *H01L 2933/0091* (2013.01); *H05K 2201/0133* (2013.01); *H05K 2201/10106* (2013.01); *H05K 2203/1316* (2013.01); *H05K 2203/1327* (2013.01)

(56) References Cited

U.S. PATENT DOCUMENTS

| | | |
|---|---|---|
| 4,603,496 A | 8/1986 | Latz |
| 4,727,648 A | 3/1988 | Savage |
| 4,837,927 A | 6/1989 | Savage |
| 5,087,212 A | 2/1992 | Hanami |
| 5,174,649 A | 12/1992 | Alston |
| 5,241,457 A | 8/1993 | Sasajima |
| 5,387,901 A | 2/1995 | Hardt |
| 5,436,809 A | 6/1995 | Brassier et al. |
| 5,490,048 A | 2/1996 | Brassier et al. |
| 5,628,557 A | 5/1997 | Huang |
| 5,632,551 A | 5/1997 | Roney et al. |
| 5,658,066 A | 8/1997 | Hirsch |
| 5,821,695 A | 10/1998 | Vilanilam |
| 6,354,714 B1 | 3/2002 | Rhodes |
| 6,426,704 B1 | 6/2002 | Hutchison |
| 6,439,743 B1 | 8/2002 | Hutchison |
| 6,450,662 B1 | 9/2002 | Hutchison |
| 6,450,664 B1 | 9/2002 | Kelly |
| 6,473,002 B1 | 10/2002 | Hutchison |
| 6,474,839 B1 | 11/2002 | Hutchison |
| 6,527,422 B1 | 3/2003 | Hutchison |
| 6,530,674 B2 | 3/2003 | Grierson et al. |
| 6,582,103 B1 | 6/2003 | Popovich |
| 6,590,235 B2 | 7/2003 | Carey et al. |
| 6,601,970 B2 | 8/2003 | Ueda et al. |
| 6,676,284 B1 | 1/2004 | Wynne |
| 6,773,138 B2 | 8/2004 | Coushaine |
| 6,824,296 B2 | 11/2004 | Souza et al. |
| 6,827,469 B2 | 12/2004 | Coushaine et al. |
| 6,880,952 B2 | 4/2005 | Kiraly et al. |
| 6,893,144 B2 | 5/2005 | Fan |
| 6,979,097 B2 | 12/2005 | Elam et al. |
| 7,093,958 B2 | 8/2006 | Coushaine |
| 7,111,964 B2 | 9/2006 | Suehiro |
| 7,132,804 B2 | 11/2006 | Lys et al. |
| 7,150,553 B2 | 12/2006 | English et al. |
| 7,159,997 B2 | 1/2007 | Reo et al. |
| 7,161,311 B2 | 1/2007 | Mueller et al. |
| 7,210,957 B2 | 5/2007 | Mrakovich et al. |
| 7,221,104 B2 | 5/2007 | Lys et al. |
| 7,229,192 B2 | 6/2007 | Mayfield et al. |
| 7,261,435 B2 | 8/2007 | Gould et al. |
| 7,267,461 B2 | 9/2007 | Kan et al. |
| 7,360,925 B2 | 4/2008 | Coushaine |
| 7,414,269 B2 | 8/2008 | Grotsch |
| 7,455,422 B2 | 11/2008 | Gould et al. |
| 7,456,499 B2 | 11/2008 | Loh |
| 7,481,552 B2 | 1/2009 | Mayfield et al. |
| 7,481,566 B2 | 1/2009 | Han |
| 7,530,716 B2 | 5/2009 | Mayfield et al. |
| 7,540,761 B2 | 6/2009 | Weber et al. |
| 7,549,786 B2 | 6/2009 | Higley et al. |
| 7,575,332 B2 | 8/2009 | Cok |
| 7,595,113 B2 | 9/2009 | Miyoshi |
| 7,604,365 B2 | 10/2009 | Chang |
| 7,654,703 B2 | 2/2010 | Kan et al. |
| 7,700,965 B2 | 4/2010 | Chang |
| 7,703,951 B2 | 4/2010 | Piepgras et al. |
| 7,712,926 B2 | 5/2010 | Matheson |
| 7,727,009 B2 | 6/2010 | Goto |
| 7,731,396 B2 | 6/2010 | Fay et al. |
| 7,744,266 B2 | 6/2010 | Higley et al. |
| 7,766,518 B2 | 8/2010 | Piepgras et al. |
| 7,806,562 B2 | 10/2010 | Behr et al. |
| 7,810,955 B2 | 10/2010 | Stimac et al. |
| 7,810,995 B2 | 10/2010 | Fadler et al. |
| 7,841,753 B2 | 11/2010 | Liu |
| 7,857,482 B2 | 12/2010 | Reo et al. |
| 7,866,847 B2 | 1/2011 | Zheng |
| 7,878,683 B2 | 2/2011 | Logan et al. |
| 7,918,589 B2 | 4/2011 | Mayfield et al. |
| 7,922,364 B2 | 4/2011 | Tessnow et al. |
| 7,923,907 B2 | 4/2011 | Tessnow et al. |
| 7,952,114 B2 | 5/2011 | Gingrich, III et al. |
| 7,961,113 B2 | 6/2011 | Rabiner et al. |
| 7,972,038 B2 | 6/2011 | Albright et al. |
| 7,988,336 B1 | 8/2011 | Harbers et al. |
| 7,997,758 B2 | 8/2011 | Zhang |
| 8,033,680 B2 | 10/2011 | Sharrah et al. |
| 8,052,310 B2 | 11/2011 | Gingrich, III et al. |
| 8,066,403 B2 | 11/2011 | Sanfilippo et al. |
| 8,076,683 B2 | 12/2011 | Ku |
| 8,113,680 B2 | 2/2012 | O'Brien et al. |
| 8,154,864 B1 | 4/2012 | Nearman et al. |
| 8,172,436 B2 | 5/2012 | Coleman et al. |
| 8,207,546 B2 | 6/2012 | Harada |
| 8,262,250 B2 | 9/2012 | Li |
| 8,297,788 B2 | 10/2012 | Bishop |
| 8,314,566 B2 | 11/2012 | Steele |
| 8,348,460 B2 | 1/2013 | Bachl |
| 8,371,723 B2 | 2/2013 | Nall |
| 8,434,897 B2 | 5/2013 | Logan et al. |
| 8,434,898 B2 | 5/2013 | Sanfilippo et al. |
| 8,449,128 B2 | 5/2013 | Ko |
| 8,454,193 B2 | 6/2013 | Simon et al. |
| 8,525,190 B2 | 9/2013 | Donofrio |
| 8,545,045 B2 | 10/2013 | Tress |
| 8,552,456 B1 | 10/2013 | Sun |
| 8,575,646 B1 | 11/2013 | Shum |
| 8,598,778 B2 | 12/2013 | Allen |
| 8,616,720 B2 | 12/2013 | Carney et al. |
| 8,697,458 B2 | 4/2014 | Nolan |
| 8,702,265 B2 | 4/2014 | May |
| 8,748,202 B2 | 6/2014 | Kwon |
| 8,764,220 B2 | 7/2014 | Chan et al. |
| 8,791,485 B2 | 7/2014 | Ohbayashi |

(56) References Cited

U.S. PATENT DOCUMENTS

| | | |
|---|---|---|
| 8,820,964 B2 | 9/2014 | Gould |
| 8,876,322 B2 | 11/2014 | Alexander |
| 8,876,325 B2 | 11/2014 | Lu et al. |
| 8,969,894 B2 | 3/2015 | Lee |
| 8,998,448 B2 | 4/2015 | Chang |
| 9,016,895 B2 | 4/2015 | Handsaker |
| 9,052,075 B2 | 6/2015 | Demuynck et al. |
| 9,157,622 B2 | 10/2015 | Yanping |
| 9,188,290 B2 | 11/2015 | Lay et al. |
| 9,285,085 B2 | 3/2016 | Carney et al. |
| 9,518,706 B2 | 12/2016 | Chan et al. |
| 9,605,812 B2 | 3/2017 | Van De Ven et al. |
| 9,651,227 B2 | 5/2017 | Pickard et al. |
| 9,666,772 B2 | 5/2017 | Ibbetson |
| 9,722,158 B2 | 8/2017 | Chan et al. |
| 9,874,333 B2 | 1/2018 | Lay et al. |
| 9,976,710 B2 | 5/2018 | Meir |
| 9,995,444 B2 | 6/2018 | Leichner |
| 10,030,828 B2 | 7/2018 | Meir |
| 10,100,988 B2 | 10/2018 | Rodgers et al. |
| 10,228,099 B2 | 3/2019 | Meir |
| 10,378,705 B2 | 8/2019 | Meir |
| 10,465,864 B2 | 11/2019 | Leichner |
| 10,584,860 B2 | 3/2020 | Dungan et al. |
| 10,612,747 B2 | 4/2020 | Rodgers et al. |
| 2002/0117692 A1 | 8/2002 | Lin |
| 2003/0058658 A1 | 3/2003 | Lee |
| 2003/0072156 A1 | 4/2003 | Pohlert et al. |
| 2003/0198049 A1 | 10/2003 | Hulse |
| 2004/0070855 A1 | 4/2004 | Benitez |
| 2005/0092517 A1 | 5/2005 | Fan |
| 2005/0221518 A1 | 10/2005 | Andrews |
| 2005/0225985 A1 | 10/2005 | Catalano |
| 2005/0280016 A1 | 12/2005 | Mok |
| 2005/0286265 A1 | 12/2005 | Zampini et al. |
| 2006/0134440 A1 | 6/2006 | Crivello |
| 2006/0141851 A1 | 6/2006 | Matsui et al. |
| 2006/0146531 A1 | 7/2006 | Reo et al. |
| 2006/0187653 A1 | 8/2006 | Olsson |
| 2007/0064428 A1 | 3/2007 | Beauchamp |
| 2007/0092736 A1 | 4/2007 | Boardman |
| 2007/0103902 A1 | 5/2007 | Hsiao |
| 2007/0205425 A1 | 9/2007 | Harada |
| 2007/0235751 A1 | 10/2007 | Radkov |
| 2008/0048200 A1 | 2/2008 | Mueller |
| 2008/0080196 A1 | 4/2008 | Ruud |
| 2008/0144322 A1 | 6/2008 | Norfidathul |
| 2008/0165530 A1 | 7/2008 | Hendrikus |
| 2008/0212319 A1* | 9/2008 | Klipstein ............... F21L 4/08 362/231 |
| 2008/0244944 A1 | 10/2008 | Nall |
| 2008/0298058 A1 | 12/2008 | Kan et al. |
| 2008/0315228 A1 | 12/2008 | Krames |
| 2009/0021936 A1 | 1/2009 | Stimac et al. |
| 2009/0109539 A1 | 4/2009 | Devos |
| 2009/0167203 A1 | 7/2009 | Dahlman et al. |
| 2009/0195168 A1 | 8/2009 | Greenfield |
| 2009/0225546 A1 | 9/2009 | Pearson |
| 2009/0272996 A1 | 11/2009 | Chakraborty |
| 2009/0310354 A1 | 12/2009 | Zampini et al. |
| 2009/0321766 A1 | 12/2009 | Chang |
| 2010/0008090 A1 | 1/2010 | Li |
| 2010/0033948 A1 | 2/2010 | Harbers et al. |
| 2010/0060157 A1 | 3/2010 | Shi |
| 2010/0060202 A1 | 3/2010 | Melanson et al. |
| 2010/0072488 A1 | 3/2010 | Bierhuizen |
| 2010/0246179 A1 | 9/2010 | Long et al. |
| 2010/0254134 A1 | 10/2010 | McCanless |
| 2010/0308354 A1 | 12/2010 | David |
| 2011/0013387 A1 | 1/2011 | Kanade et al. |
| 2011/0025951 A1 | 2/2011 | Jones |
| 2011/0051394 A1* | 3/2011 | Bailey .............. F21V 5/04 362/84 |
| 2011/0051407 A1 | 3/2011 | St. Ives et al. |
| 2011/0051425 A1 | 3/2011 | Tsuchiya |
| 2011/0062470 A1 | 3/2011 | Bierhuizen |
| 2011/0089453 A1 | 4/2011 | Min |
| 2011/0122643 A1 | 5/2011 | Spark et al. |
| 2011/0134634 A1 | 6/2011 | Gingrich, III et al. |
| 2011/0136374 A1 | 6/2011 | Mostoller et al. |
| 2011/0164426 A1 | 7/2011 | Lee |
| 2011/0193490 A1 | 8/2011 | Kumar |
| 2011/0198067 A1 | 8/2011 | Hada |
| 2011/0210364 A1* | 9/2011 | Nolan ............... H05K 3/284 257/98 |
| 2011/0222270 A1 | 9/2011 | Porciatti |
| 2011/0255287 A1 | 10/2011 | Li |
| 2011/0280020 A1 | 11/2011 | Chen |
| 2011/0303935 A1 | 12/2011 | Chern |
| 2012/0002417 A1 | 1/2012 | Li |
| 2012/0025241 A1 | 2/2012 | Xiao |
| 2012/0025729 A1 | 2/2012 | Melanson et al. |
| 2012/0051048 A1 | 3/2012 | Smit et al. |
| 2012/0051056 A1 | 3/2012 | Derks et al. |
| 2012/0051068 A1 | 3/2012 | Pelton et al. |
| 2012/0087124 A1 | 4/2012 | Ravillisetty |
| 2012/0106152 A1 | 5/2012 | Zheng et al. |
| 2012/0140474 A1 | 6/2012 | Jurik et al. |
| 2012/0250309 A1 | 10/2012 | Handsaker |
| 2012/0267650 A1 | 10/2012 | Schubert |
| 2013/0021797 A1 | 1/2013 | Kubo |
| 2013/0021811 A1 | 1/2013 | Goldwater |
| 2013/0063939 A1 | 3/2013 | Kondo |
| 2013/0083524 A1 | 4/2013 | Devorris |
| 2013/0134445 A1 | 5/2013 | Tarsa |
| 2013/0214691 A1 | 8/2013 | Chen |
| 2013/0265750 A1 | 10/2013 | Pickard |
| 2013/0272000 A1 | 10/2013 | Pearson |
| 2013/0292709 A1 | 11/2013 | Tong |
| 2013/0313965 A1 | 11/2013 | Chiang |
| 2014/0001952 A1 | 1/2014 | Harris et al. |
| 2014/0036500 A1 | 2/2014 | Eggleton |
| 2014/0043812 A1 | 2/2014 | Moreau |
| 2014/0168997 A1 | 6/2014 | Lee |
| 2014/0176016 A1 | 6/2014 | Li et al. |
| 2014/0177262 A1 | 6/2014 | Lai |
| 2014/0268720 A1 | 9/2014 | Dungan et al. |
| 2014/0268748 A1 | 9/2014 | Lay et al. |
| 2014/0268810 A1 | 9/2014 | Marquardt |
| 2014/0334142 A1* | 11/2014 | Levante ............. F21S 4/005 362/222 |
| 2015/0034976 A1 | 2/2015 | Kim |
| 2015/0041839 A1 | 2/2015 | Sakai |
| 2015/0062965 A1 | 3/2015 | Oh |
| 2015/0117022 A1 | 4/2015 | Meir |
| 2015/0144918 A1 | 5/2015 | Cho |
| 2015/0145406 A1 | 5/2015 | Li |
| 2015/0252982 A1 | 9/2015 | Demuynck |
| 2015/0276170 A1 | 10/2015 | Motoyanagi |
| 2015/0283768 A1 | 10/2015 | Marquardt |
| 2015/0316219 A1 | 11/2015 | Mallory |
| 2015/0326767 A1 | 11/2015 | Kim |
| 2016/0003424 A1 | 1/2016 | Wu |
| 2016/0035944 A1 | 2/2016 | Spanard |
| 2016/0076743 A1 | 3/2016 | Deutsch |
| 2016/0195225 A1 | 7/2016 | Carney |
| 2016/0201861 A1 | 7/2016 | Meir |
| 2016/0327249 A1 | 11/2016 | Pearson |
| 2016/0327256 A1 | 11/2016 | Hall |
| 2017/0009957 A1 | 1/2017 | Lim et al. |
| 2017/0038015 A1 | 2/2017 | Lunz |
| 2017/0250319 A1 | 8/2017 | Yajima |
| 2017/0261186 A1 | 9/2017 | Meir et al. |
| 2017/0261187 A1 | 9/2017 | Meir |
| 2019/0219251 A1 | 7/2019 | Meir |
| 2019/0267523 A1 | 8/2019 | Min |
| 2019/0383450 A1 | 12/2019 | Meir |
| 2020/0096178 A1 | 3/2020 | Aviram |
| 2020/0141546 A1 | 5/2020 | Meir |
| 2020/0144468 A1 | 5/2020 | Meir |
| 2020/0191370 A1 | 6/2020 | Shohat |

(56) References Cited

U.S. PATENT DOCUMENTS

FOREIGN PATENT DOCUMENTS

| | | |
|---|---|---|
| CN | 201590432 U | 9/2010 |
| CN | 201739849 U | 2/2011 |
| CN | 101997074 A | 3/2011 |
| CN | 202040752 U | 11/2011 |
| CN | 102269351 A | 12/2011 |
| EP | 0592746 B1 | 3/1997 |
| EP | 2474775 B1 | 11/2013 |
| EP | 2256833 B1 | 4/2014 |
| EP | 2484956 B1 | 6/2014 |
| ES | 1211538 U | 5/2018 |
| GB | 2457016 A | 8/2009 |
| JP | 2011508406 T | 3/2011 |
| JP | 2011204495 A | 10/2011 |
| JP | 2011204658 A | 10/2011 |
| KR | 1020070039683 A | 4/2007 |
| KR | 20090013704 A | 2/2009 |
| KR | 100974942 B1 | 8/2010 |
| KR | 1020120050280 A | 5/2012 |
| KR | 1020110106033 A | 6/2013 |
| WO | 2002015281 A2 | 2/2002 |
| WO | 2013059298 A1 | 4/2013 |
| WO | 2014082262 A1 | 5/2014 |
| WO | 2014099681 A2 | 6/2014 |
| WO | 2014099681 A3 | 12/2014 |
| WO | 2015066184 A1 | 5/2015 |
| WO | 2018140727 A1 | 8/2018 |
| WO | 2019193218 A1 | 10/2019 |
| WO | 2019213299 A1 | 11/2019 |

OTHER PUBLICATIONS

PCT/US2012/060588, International Application Serial No. PCT/US2012/060588, International Search Report and Written Opinion dated Mar. 29, 2013, Ecosense Lighting Inc. et al, 10 pages.

PCT /US2012/060588, "International Application Serial No. PCT/US2012/060588, International Preliminary Report on Patentability and Written Opinion dated May 1, 2014", Ecosense Lighting Inc. et al, 7 Pages.

PCT/US2013/075172, "International Application Serial No. PCT/US2013/075172, International Search Report and Written Opinion dated Sep. 26, 2014", Ecosense Lighting Inc., 16 Pages.

PCT/US2014/062905, International Preliminary Report on Patentability dated May 3, 2016 (7 pp).

PCT/US2014/062905, Written Opinion of the Int'l Searching Authority dated Jan. 22, 2015 (6 pp).

* cited by examiner

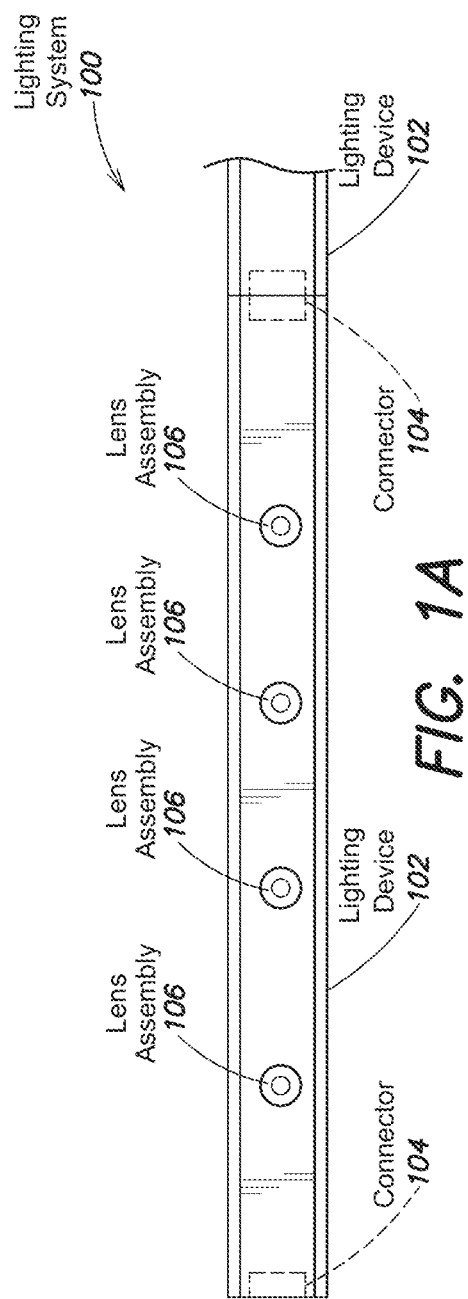
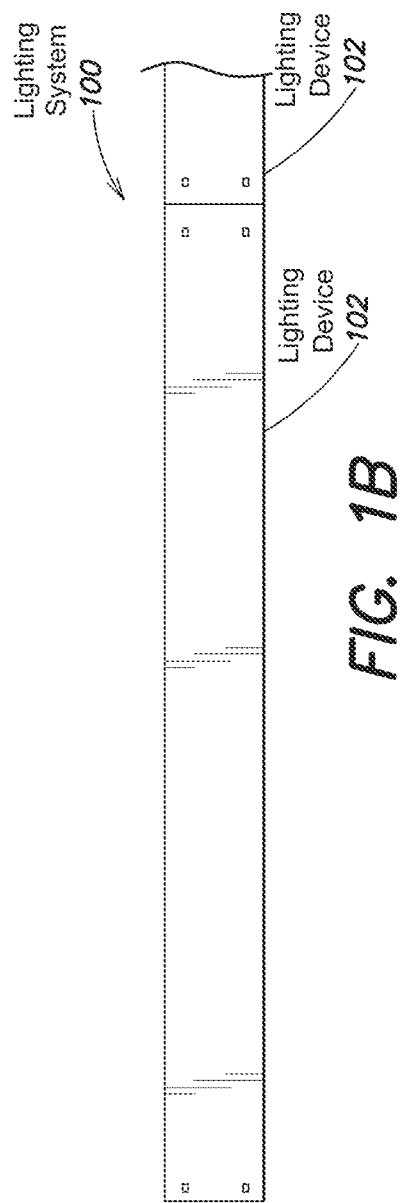

LIGHTING SYSTEM WITH LENS ASSEMBLY

CROSS-REFERENCE TO RELATED APPLICATIONS

This application claims the benefit under 35 U.S.C. § 119(e) of each of U.S. Provisional Application Ser. No. 62/305,386, titled "LED STRIP MODULE THAT INTEGRATES OPTICS ELEMENTS" filed on Mar. 8, 2016, U.S. Provisional Application Ser. No. 62/405,446, titled "LEDS AND RELATED COLOR DISTRIBUTION" filed on Oct. 7, 2016, U.S. Provisional Application Ser. No. 62/405,456, titled "IMPROVED COLOR UNIFORMITY FOR LEDS" filed on Oct. 7, 2016, U.S. Provisional Application Ser. No. 62/405,463, titled "LEDS INCLUDING TEXTURED LENS" filed on Oct. 7, 2016, U.S. Provisional Application Ser. No. 62/405,468, titled "LEDS INCLUDING A SMALL DIAMETER LENS" filed on Oct. 7, 2016, and U.S. Provisional Application Ser. No. 62/405,472, titled "LEDS INCLUDING A LENS AND REFLECTOR" filed on Oct. 7, 2016, each of which is hereby incorporated herein by reference in its entirety.

BACKGROUND

Light emitting diodes (LEDs) are typically formed from a semiconductor material that is doped to create a p-n junction. The LEDs typically emit light in a narrow spectrum (e.g., a spectrum that is smaller 100 nanometers in size) that is dependent upon the bandgap energy of the semiconductor material that forms the p-n junction. For example, an LED formed using one semiconductor material may emit light of a different color (and thereby in a different spectrum) than an LED formed using another semiconductor material.

White light has a broad spectrum (e.g., a spectrum that is larger than 200 nanometers in size), unlike the light typically emitted from an LED. White light may be formed by mixing light with different colors (and thereby different spectrums) together. For example, white light may be formed by mixing red, green, and blue light or blue and yellow light. Inexpensive LEDs that create white light (a white LED) typically use an LED configured to emit blue light (a blue LED) that is coated with a yellow phosphor. The yellow phosphor coating converts a portion of the blue light from the LED into yellow light. The mixture of the blue and yellow light forms white light.

SUMMARY

According to at least one aspect, a lighting device is provided. The lighting device comprises a circuit board, a light emitting diode (LED) mounted to the circuit board and configured to emit light, a lens disposed over the LED having a bottom surface facing the circuit board, a top surface opposite the bottom surface, and a lateral surface between the top and bottom surfaces, and an elastomer encapsulating at least part of the circuit board. The elastomer may not be in contact with at least part of the lateral surface of the lens so as to form a gap between the elastomer and the lateral surface of the lens.

In some embodiments, the circuit board is a printed circuit board such as an FR4 printed circuit board. In some embodiments, the circuit board may comprise multiple layers. In some embodiments, the circuit board may be a flexible circuit board.

In some embodiments, the lighting device further comprises a reflector having a reflective surface that faces the lateral surface of the lens and is disposed between the elastomer and the lateral surface of the lens (e.g., in the gap). In some embodiments, at least part of the reflective surface is configured to provide specular reflection. In some embodiments, at least part of the reflective surface is configured to provide diffusive reflection. In some embodiments, a surface of the reflector opposite the reflective surface contacts the elastomer. In some embodiments, a surface of the reflector opposite the reflective surface does not contact the elastomer. In some embodiments, the reflective surface is configured to reflect at least some light from the lateral surface of the lens back into the lens.

In some embodiments, at least part of the bottom surface of the lens contacts the circuit board. In some embodiments, the elastomer does not contact at least part of the top surface of the lens. In some embodiments, the gap is an air gap.

In some embodiments, the gap is at least partially filled with a material that is separate and distinct from the elastomer. In some embodiments, the material has a lower refractive index than the lens.

In some embodiments, the lens comprises a recess configured to receive the LED and provide an air gap between a surface of the LED through which light is emitted and the lens. In some embodiments, the lighting device further comprises a light scattering element disposed in the recess between the surface of the LED through which light is emitted and the lens. In some embodiments, the scattering element comprises a plurality of scattering particles dispersed in a material. In some embodiments, the scattering particles comprise titanium dioxide ($TiO_2$) and the material comprises silicone.

In some embodiments, the LED is a phosphor converted LED that emits light with an angular correlated color temperature (CCT) deviation. In some embodiments, the lens is configured to receive the light emitted from the phosphor converted LED and reduce the angular CCT deviation of the light received from the phosphor converted LED. In some embodiments, the LED is a white phosphor converted LED configured to emit white light with an angular CCT deviation.

In some embodiments, the lighting device further comprises a base mounted to the circuit board. In some embodiments, the lens is coupled to the base. In some embodiments, the elastomer comprises silicone. In some embodiments, the lens comprises silicone, glass, and/or plastic.

In some embodiments, the lighting device is configured to mount to a guide rail or a walking path to illuminate the walking path. In some embodiments, the lighting device is configured to mount to a ceiling or a ledge to illuminate at least one member selected from the group consisting of: a ceiling, a wall, and a billboard.

According to at least one aspect, a lighting device is provided. The lighting device comprises a circuit board, an LED mounted to the circuit board and configured to emit light, a lens disposed over the LED and having a bottom surface facing the circuit board, a top surface opposite the bottom surface, and a lateral surface between the top and bottom surfaces, a reflector having a reflective surface that faces the lateral surface of the lens without contacting at least part of the lateral surface of the lens so as to form a gap, and an elastomer encapsulating at least part of the circuit board.

In some embodiments, the reflector comprises a surface opposite the reflective surface. In some embodiments, the elastomer contacts at least part of the surface of the reflector opposite the reflective surface. In some embodiments, the elastomer does not contact at least part of the surface of the reflector opposite the reflective surface.

In some embodiments, the gap is an air gap. In some embodiments, the gap is at least partially filled with a material. In some embodiments, the material in the gap has a lower refractive index than the lens.

According to at least one aspect, a lighting device is provided. The lighting device comprises a circuit board, an LED mounted to the circuit board that is configured to emit light with an angular CCT deviation, a lens assembly mounted to the circuit board over the LED and configured to receive the light emitted from the LED and reduce the angular CCT deviation of the light received from the LED to make a color temperature of the light received from the LED more uniform, and an elastomer encapsulating at least part of the circuit board that is separate and distinct from the lens assembly.

In some embodiments, the lens assembly is configured to mix the light received from the LED. In some embodiments, the lens assembly is configured to collimate the mixed light to form a beam.

In some embodiments, the lens assembly comprises a lens disposed over the LED having a bottom surface that faces the circuit board, a top surface opposite the bottom surface, and a lateral surface between the top surface and the bottom surface. In some embodiments, the elastomer does not contact at least part of the lateral surface of the lens. In some embodiments, the top surface of the lens is flat (or approximately flat). In some embodiments, the top surface of the lens is curved. In some embodiments, at least a portion of the lateral surface of the lens is configured to provide total internal reflection (TIR) of at least some light. In some embodiments, the lens comprises a recess that faces the LED. In some embodiments, the recess is configured to provide an air gap between a surface of the LED through which light is emitted and the lens. In some embodiments, at least part of the recess is textured to mix light received from the LED. In some embodiments, the lens assembly comprises a light scattering element disposed between the LED and the lens. In some embodiments, the lens assembly comprises a reflector having a reflective surface that faces the lens. In some embodiments, the reflective surface of the reflector provides specular reflection, diffusive reflection, or a combination thereof. In some embodiments, the reflective surface faces the lateral surface of the lens and is configured to reflect light from the lateral surface of the lens back into the lens. In some embodiments, the lens assembly comprises a base mounted to the circuit board and wherein the reflector and the lens are configured to couple to the base.

In some embodiments, the LED comprises a phosphor converted LED. In some embodiments, the phosphor converted LED is a white phosphor converted LED. In some embodiments, the circuit board is a flexible printed circuit board. In some embodiments, the lighting device comprises a connector mounted to the circuit board and electrically coupled to the LED. In some embodiments, the connector is configured to electrically couple the LED to another device such as another lighting device or a power adapter. In some embodiments, the elastomer comprises silicone.

In some embodiments, the lighting device is configured to mount to a guide rail or a walking path to illuminate the walking path. In some embodiments, the lighting device is configured to mount to a ceiling or a ledge to illuminate at least one member selected from the group consisting of: a ceiling, a wall, and a billboard.

In some embodiments, the lighting device may be implemented as a strip lighting device having a length (e.g., approximately six inches), a width that is less than the length (e.g., approximately one inch), and a height that is less than the width (e.g., approximately half an inch). In some embodiments, the strip lighting device comprises a plurality of LEDs that are spaced along the length of the strip lighting device (e.g., the LEDs may be spaced apart by approximately one inch).

BRIEF DESCRIPTION OF THE DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIG. 1A shows a top view of an example lighting system, according to some embodiments of the technology described herein;

FIG. 1B shows a bottom view of the example lighting system of FIG. 1A, according to some embodiments of the technology described herein;

DETAILED DESCRIPTION

As discussed above, some LEDs have a phosphor coating that converts a portion of the light from the LED into light of another color (a phosphor converted LED). Phosphor converted LEDs may be capable of producing light with a broad spectrum such as white light. For example, a white phosphor converted LED may be formed by coating a blue LED with a yellow phosphor layer. Thereby, a portion of the blue light from the blue LED is converted into yellow light so as to create white light.

Figure 7A:
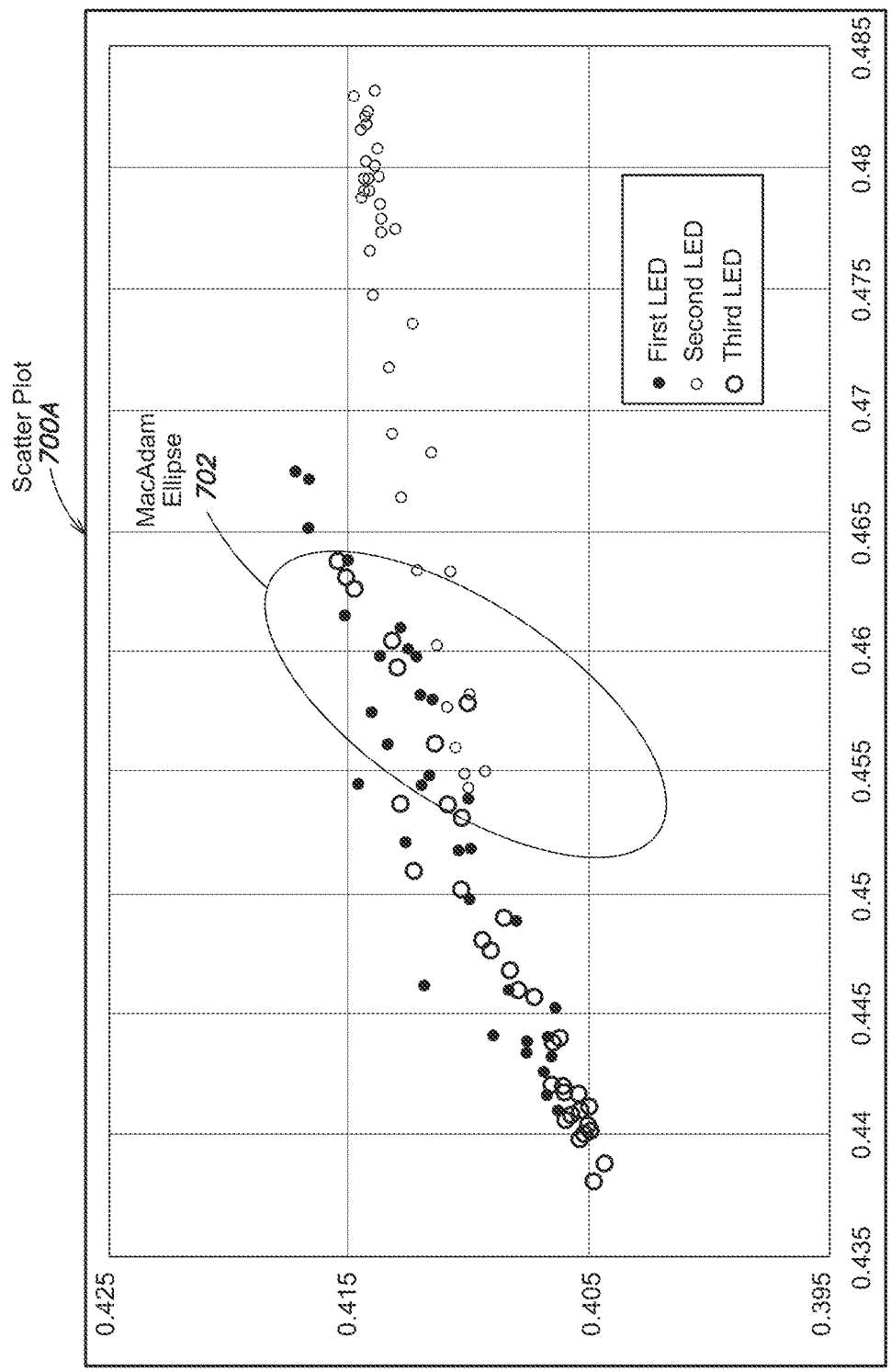
FIG. 7A shows a scatter plot illustrating the angular correlated color temperature (CCT) deviation exhibited by three different white phosphor converted LEDs, according to some embodiments of the technology described herein.

The inventors have appreciated that phosphor converted LEDs, such as white phosphor converted LEDs, typically exhibit angular correlated color temperature (CCT) deviation. Angular CCT deviation may be a shift in a color temperature of light that is a function of the emission angle of the light. For example, the light pattern produced by a white phosphor converted LED on a surface may appear white near the center of the light pattern and off-white near the edges of the light pattern. A scatter plot 700A in FIG. 7A illustrates the angular CCT deviation produced by white phosphor converted LEDs. The scatter plot 700A comprises a set of points for each of three different white phosphor converted LEDs plotted in a CIE 1931 color space and a MacAdam ellipse 702 for a color temperature of 2700 degrees Kelvin (K). Each set of points is representative of the color coordinates of light from a particular white phosphor converted LED at different emission angles. The MacAdam ellipse 702 may be representative of the set of color coordinates that will appear to be 2700 K to a human observer. As shown in FIG. 7A, none of the three different white phosphor converted LEDs produce light within the MacAdam Ellipse 702 across the entire range of emission angles. Thereby, the angular CCT deviation may be visible to a human observer.

Figure 7B:
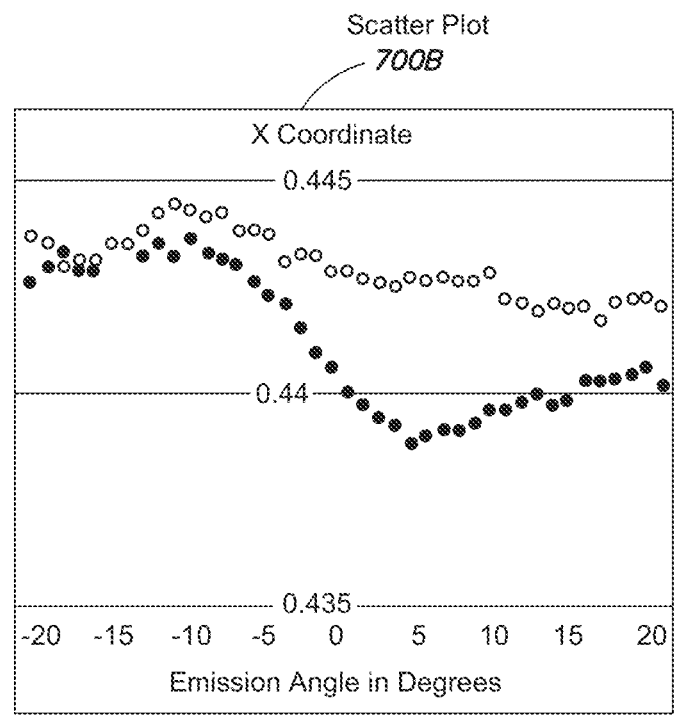
FIGS. 7B and 7C show scatter plots illustrating the angular CCT deviation exhibited by a white phosphor converted LED with a lens assembly configured to reduce the angular CCT deviation, according to some embodiments of the technology described herein.
Figure 7C:
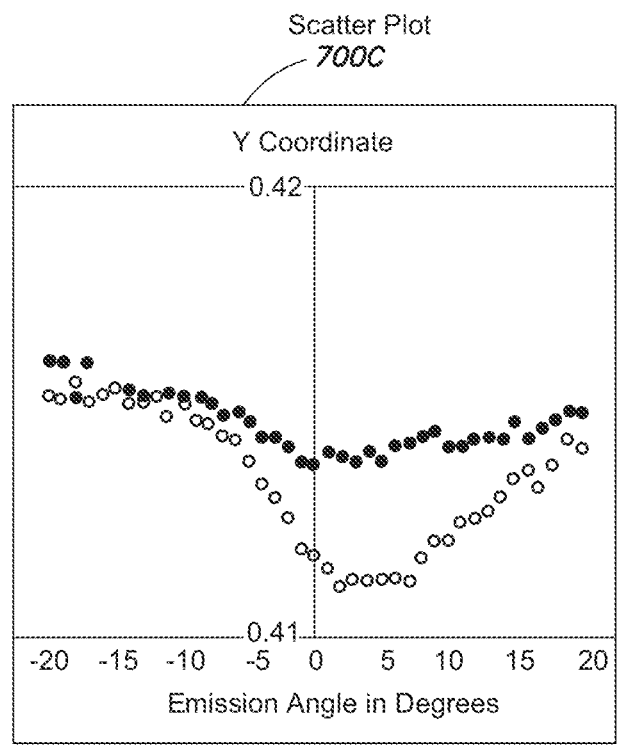

The inventors have devised new techniques to correct the angular CCT deviation of light from phosphor converted LEDs to produce light with a more uniform color temperature across a range of emission angles. In some embodiments, the angular CCT deviation of light from phosphor converted LEDs may be reduced using a lens assembly disposed above the LED. The lens assembly may be configured to mix the light from the LED to make the color temperature of the light more uniform and collimate the mixed light to produce a beam. FIGS. 7B and 7C show scatter plots illustrating the angular CCT deviation produced by lighting devices with such a lens assembly disposed over a phosphor converted LED. In particular, FIGS. 7B and 7C shows the x and y coordinates, respectively, in a CIE 1931 color space of light emitted from the lens assembly across a range of emission angles. As shown, the x color coordinate of the light remains between 0.435 and 0.445 across the plotted range of emission angles. Similarly, the y color coordinate of the light remains between 0.41 and 0.42 across the plotted range of emission angles.

In addition, the inventors have devised new techniques to integrate lenses into LED lighting devices at least partially encapsulated with an elastomer. The inventors have appreciated that the elastomer encapsulating LED lighting devices may have a similar (or same) refractive index as the lens thereby diminish the efficacy of the lens. For example, light may simply pass from a surface of the lens into the elastomer without being reflected or otherwise redirected because both the lens and the elastomer have a similar (or same) refractive index. Accordingly, the inventors have devised LED lighting devices that comprise a gap (e.g., an air gap) between the elastomer encapsulating the LED lighting device such that the refractive index of the media in contact with the lens is different (e.g., lower) than that of the lens. Thereby, the surfaces of the lens may be constructed to reflect or otherwise redirect light.

Accordingly, some aspects of the present disclosure relate to lighting systems that provide light with a uniform (or approximately uniform) color temperature across a range of emission angles using lens assemblies. A lens assembly may be a set of one or more components comprising at least one lens. Example components apart from the at least one lens that may be included in a lens assembly include reflectors, scattering elements, mirrors, and structural elements to hold a lens (or any other component of the lens assembly) in place.

The lighting systems may comprise a circuit board onto which various electrical components may be mounted. The circuit board may be, for example, an FR4 printed circuit board (PCB). The circuit board may be flexible to allow the lighting system to bend without breaking and, thereby, ease installation of the lighting system. An LED may be mounted to the circuit board and configured to emit light. The light emitted from the LED may have an angular CCT deviation such as a phosphor converted LED.

The lighting system may comprise a lens assembly disposed over the LED to receive light from the LED and reduce the angular CCT deviation of the received light. For example, the lens assembly may mix the light received from the LED to make the color temperature more uniform and collimate the mixed light to form a beam. The lens assembly may comprise a lens and a reflector disposed over the LED. The lens may receive light from the LED through a bottom surface and provide light through a top surface. The lens may be, for example, a monolithic lens constructed from any of a variety of materials such as silicone, glass, and/or a plastic (e.g., acrylic or polycarbonate). The lens may omit scattering particles and/or phosphors. The reflector may comprise a reflective surface that faces the lens and reflects light that leaves a lateral surface of the lens back into the lens. Thereby, the light in the lens may be emitted through the top surface of the lens. The reflective surface may be configured to provide diffuse and/or specular reflection. The reflector may be, for example, a monolithic reflector constructed from a plastic (e.g., acrylic or polycarbonate) coated in a material such as a paint or a metal to achieve the desired reflection (e.g., diffuse and/or specular reflection).

The lighting system may comprise an elastomer that at least partially encapsulates the circuit board. For example, the elastomer may be in contact with the circuit board and one or more components of the lens assembly such as the reflector. The elastomer not be in contact with all of the components of the lens assembly. For example, the elastomer may not be in contact with the lens so as to provide a gap (e.g., an air gap) between the lens and the elastomer. The elastomer may protect the circuit board and/or electronic components mounted to the circuit board from the environment. Example elastomers include silicones and rubbers. The elastomer encapsulating at least part of the circuit board may be separate and distinct from the other components of the lighting system such as the lens and/or the entire lens assembly.

It should be appreciated that the embodiments described herein may be implemented in any of numerous ways. Examples of specific implementations are provided below for illustrative purposes only. It should be appreciated that these embodiments and the features/capabilities provided may be used individually, all together, or in any combination of two or more, as aspects of the technology described herein are not limited in this respect.

Example Lighting Systems

FIGS. 1A and 1B show top and bottom views, respectively, of an example lighting system 100. As shown, the lighting system 100 is constructed as a strip lighting system that comprises a plurality of electrically coupled lighting devices 102. Thereby, the length of the lighting system 100 may be customized by adding (or removing) lighting devices 102. Each of the lighting devices 102 may comprise LEDs that are electrically coupled to a connector 104. In turn, the connector 104 may electrically couple to an external device such as another lighting device 102 or a power adapter. The LEDs may receive power from the external device via the connector 104 and emit light. The connector 104 may be implemented as a male or female connectors as shown below in FIGS. 2A and 2B.

The lighting device 102 may comprise a plurality of lens assemblies 106 disposed over the LEDs. The lens assemblies 106 may change at least one characteristic of the light emitted from the LEDs. For example, the LEDs may be phosphor converted LEDs that emit light with an angular CCT deviation. In this example, the lens assemblies 106 may receive light from the LED and make the color temperature of the light more uniform. Additionally (or alternatively), the lens assembly 106 may adjust a light distribution pattern of the LED. For example, the lens assembly 106 may create a circular beam of light or an oblong beam of light.

Figure 2A:
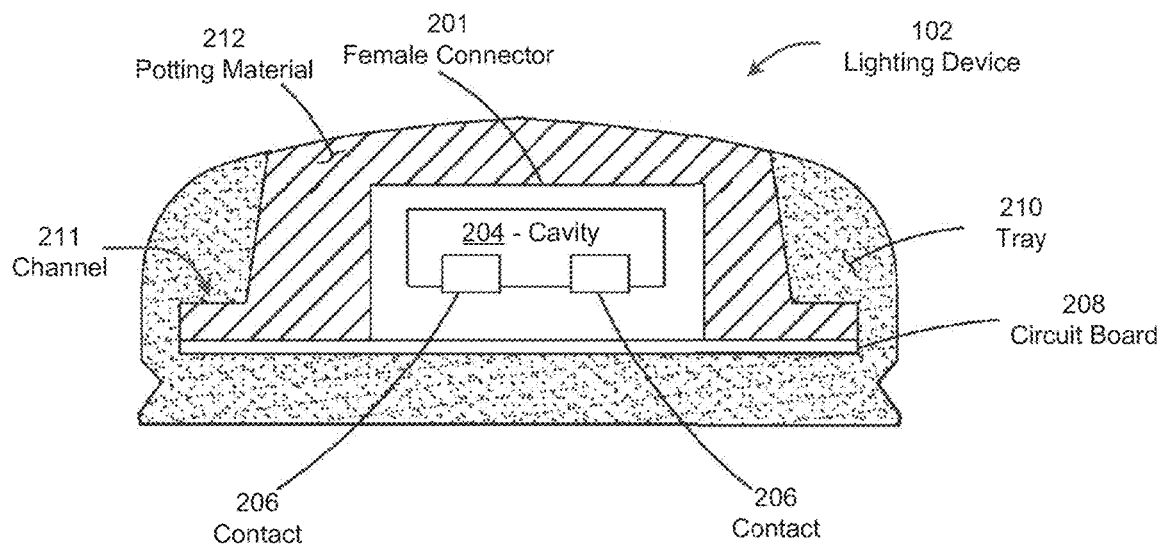
FIG. 2A shows a front view of the example lighting system of FIG. 1A, according to some embodiments of the technology described herein.
Figure 2B:
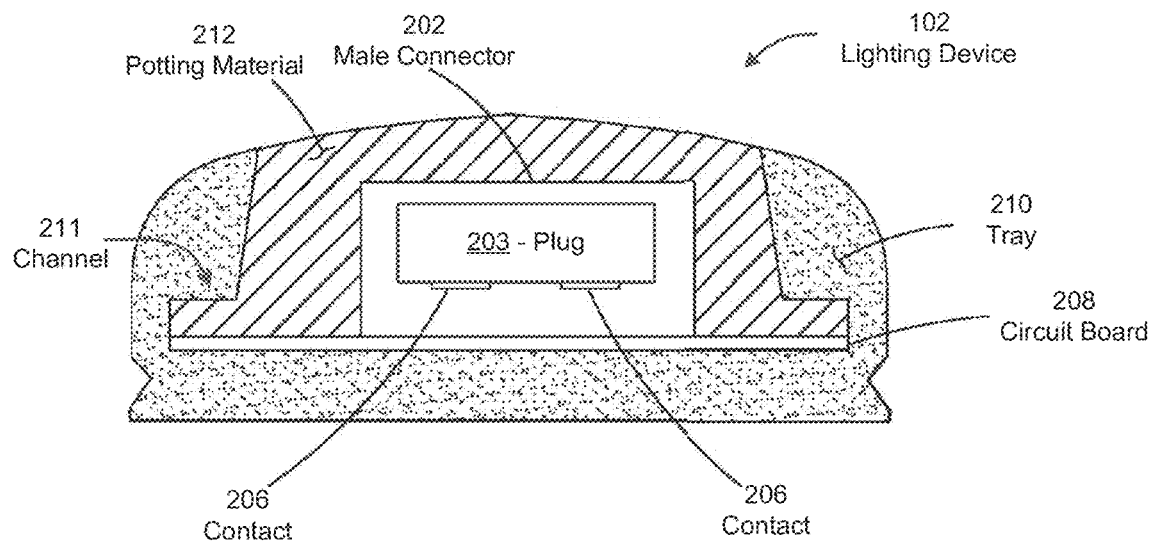
FIG. 2B shows a rear view of the example lighting system of FIG. 1A, according to some embodiments of the technology described herein.

FIGS. 2A and 2B show front and rear views, respectively, of the lighting device 102. As shown, the lighting device 102 comprises a tray 210 with a channel 211 into which a circuit board 208 may be inserted. The circuit board 208 may be, for example, a flexible PCB to allow the lighting device 102 to bend without breaking. Once the circuit board 208 has been inserted into the tray 210, potting material 212 may be added to the lighting device 102 to fill the tray 210. Thereby, the potting material 212 may be contact with the circuit board 208, the tray 210, and/or the connector 104 (implemented as female connector 201 or male connector 202). The potting material 212 and/or the tray 210 may be constructed from an elastomer. Thereby, the circuit board 208 may be at least partially encapsulated with an elastomer. For example, both the potting material 212 and the tray 210 may be constructed from silicone. It should be appreciated that the potting material 212 may have a different material composition than the channel 210.

The circuit board 208 may be electrically coupled to other components using the connector 104 that may be implemented as a female connector 201 or a male connector 202. The female connector 201 comprises a cavity 204 with multiple contacts 206. The cavity 204 may be configured to receive a plug of a corresponding male connector (e.g., male connector 202). The male connector 202 may comprise a plug 203 with contacts 206 disposed on a bottom surface of the plug 203. The plug 203 may be constructed to be inserted into a female connector (e.g., female connector 201).

Figure 3:
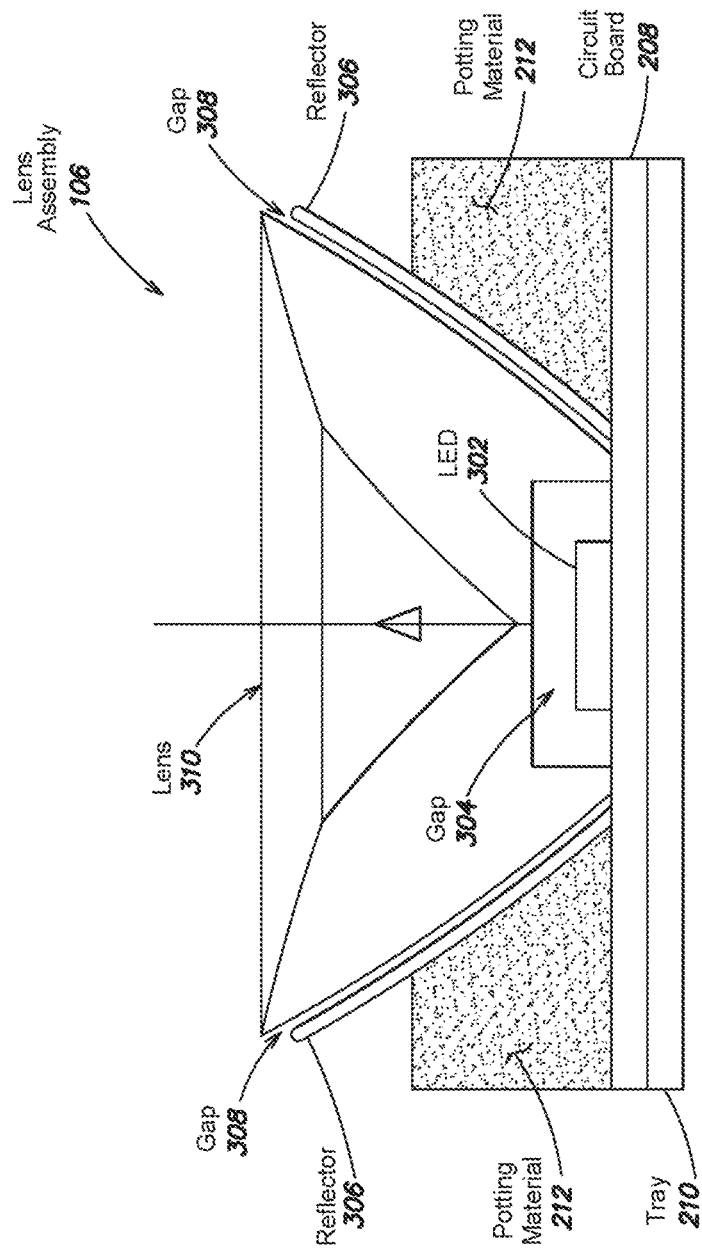
FIG. 3 shows a cross-sectional view of the example lighting system of FIG. 1A, according to some embodiments of the technology described herein.

FIG. 3 shows a cross-section of the lens assembly 106 in the lighting device 102. As shown, the lens assembly 106 comprises a lens 310 and a reflector 306 disposed over an LED 302 mounted to the circuit board 208. The lens 310 comprises a recess that is configured to receive the LED 302 and provide a gap 304 (e.g., an air gap) between the LED 302 and the lens 310. The lens 310 may receive the light from the LED 302 and direct the light towards the reflector 306. In turn, the reflector 306 may be configured to reflect light that leaves a lateral surface of the lens 310 back into the lateral surface of the lens 310. The reflector 306 may be constructed to provide a gap 308 between the lateral surface of the lens 310 and a reflective surface of the reflector 306. The gap 308 may be left unfilled to form an air gap. Alternatively, the gap 308 may be filled with a material to keep debris from entering the gap 308. In some embodiments, the material employed to fill the gap 308 may have a refractive index that is lower than the refractive index of the lens 310 to operate similarly to an air gap. In other embodiments, the material employed to fill the gap 308 may have the same (or similar) refractive index as the lens 310. In yet other embodiments, the material employed to fill the gap 308 may have a greater refractive index than the lens 310. Suitable materials to fill the gap 308 include elastomers such as silicone.

It should be appreciated that various alterations may be made to the cross-section of the lens assembly 106 in FIG. 3 without departing from the scope of the present disclosure. For example, the reflector 306 may be removed and the lateral surface of the lens may be configured to reflect light back into the lens without the reflector 306. Alternatively, the potting material 212 may not be in contact with at least part of an opposite surface of the reflector 306 that faces away from the lens 310. Thereby, there may be a gap between the potting material 212 and the reflector 306.

Example Lens Assemblies

Figure 4:
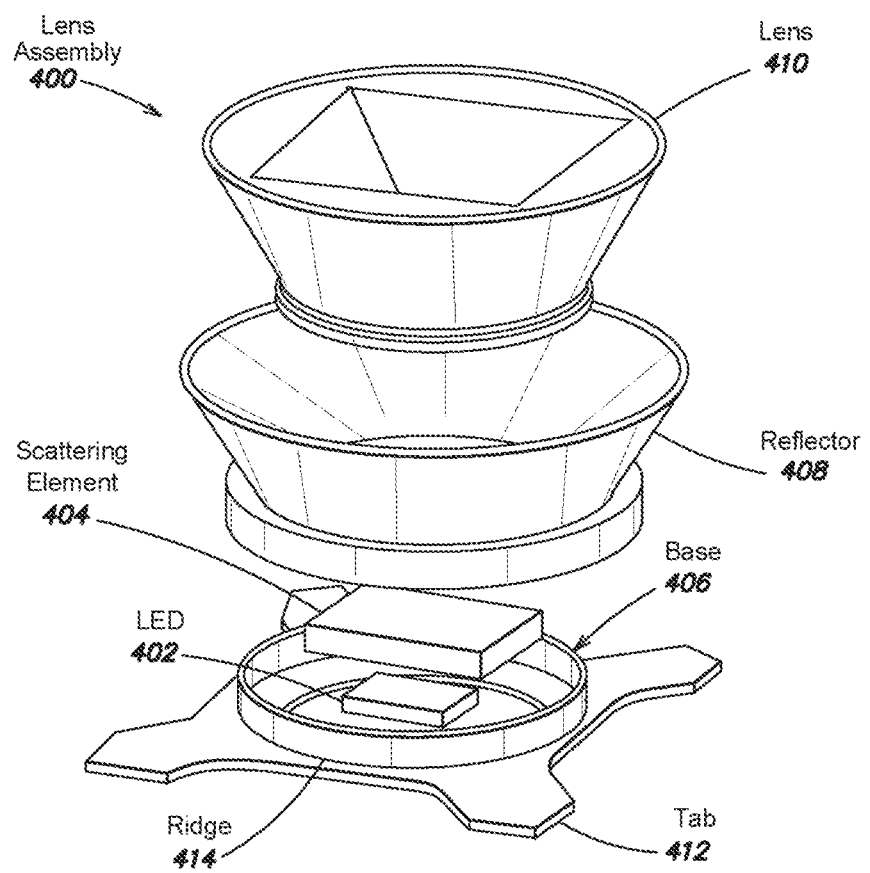
FIG. 4 shows an exploded view of an example lens assembly, according to some embodiments of the technology described herein.

As discussed above, a lens assembly (e.g., lens assembly 106) may be disposed above an LED to adjust one or more characteristics of the light emitted from the LED. An example of such a lens assembly is shown in FIG. 4 by an exploded view of a lens assembly 400. As shown, the lens assembly 400 is disposed over an LED 402 and comprises a scattering element 404, a base 406, a reflector 408, and a lens 410. The lens assembly 400 may be constructed to receive light from the LED, mix the received light to make the color temperature more uniform, and collimate the light to form a beam. For example, the scattering element 404, the lens 410, and/or the reflector 408 may scatter light to cause mixing and, thereby, make the color temperature more uniform. In some embodiments, the light that leaves a lateral surface of the lens 410 (e.g., as a result of the mixing) may be reflected back into the lens 410 towards a top surface of the lens 410. Thereby, the mixed light may be collimated so as to form the beam.

The LED 402 may be a semiconductor device that is configured to emit light (e.g., LED 302). The LED 402 may be configured to emit light with an angular CCT deviation such as a phosphor converted LED. The LED 402 may be mounted to a circuit board (e.g., circuit board 208).

The base 406 may be constructed to hold the lens assembly 400 in place over the LED 402. For example, the base 406 may be mounted to the same circuit board that the LED 402 is mounted to. The base 406 may comprise one or more tabs 412 to facilitate mounting the base 406 on a circuit board. For example, the tabs 412 may be affixed to the circuit board using through holes in the circuit board.

The base 406 may serve as an anchor point for one or more other components of the lens assembly (e.g., the scattering element 404, the reflector 408, and/or the lens 410). The base 406 may comprise a ridge 414 to couple to the one or more other components of the lens assembly 400. For example, the ridge 414 may have an outer lip that the reflector 408 may engage to form a snap-fit. Additionally (or alternatively), the ridge 414 may have an inner lip that the lens 410 may engage to form a snap-fit.

The scattering element 404 may be disposed between the LED 402 and the lens 410 and configured to scatter light from the LED 402. The scattering element 404 may be constructed by dispersing a plurality of scattering particles in a material. For example, the scattering element 404 may be constructed by distributing a plurality of titanium dioxide ($TiO_2$) particles in silicone. The scattering element 404 may be implemented in any of a variety of shapes and sizes. For example, the scattering element 404 may be implemented as a block or a sheet. The scattering element 404 may comprise one or more textured surfaces to improve light transmission through the scattering element 404. For example, a surface of the scattering element 404 that faces the LED 402 may be textured.

The lens 410 may be a refractive element that receives light from the LED 402 and/or from the scattering element 404. The lens 410 may be, for example, a monolithic lens constructed from silicone, glass, and/or plastic.

The reflector 408 may be a reflective element that is configured to reflect light (e.g., using dispersive reflection and/or specular reflection) from a lateral surface of the lens 410 back into the lens 410. The reflector 410 may be, for example, a monolithic reflector constructed from a plastic such as acrylic and polycarbonate coated in a material such as paint or a metal (e.g., aluminum, copper, and nickel).

Figure 5A:
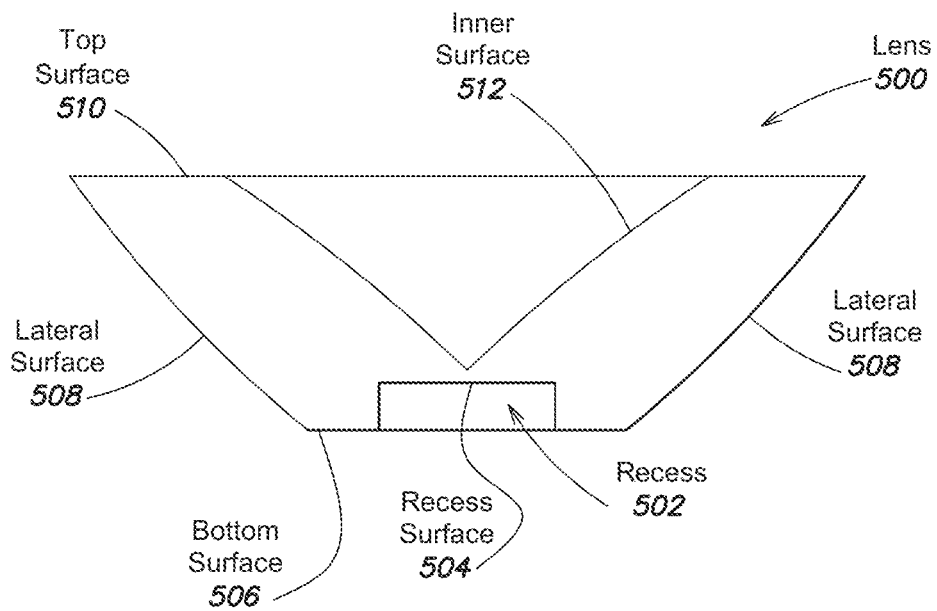
FIG. 5A shows a cross-sectional view of an example lens, according to some embodiments of the technology described herein.
Figure 5B:
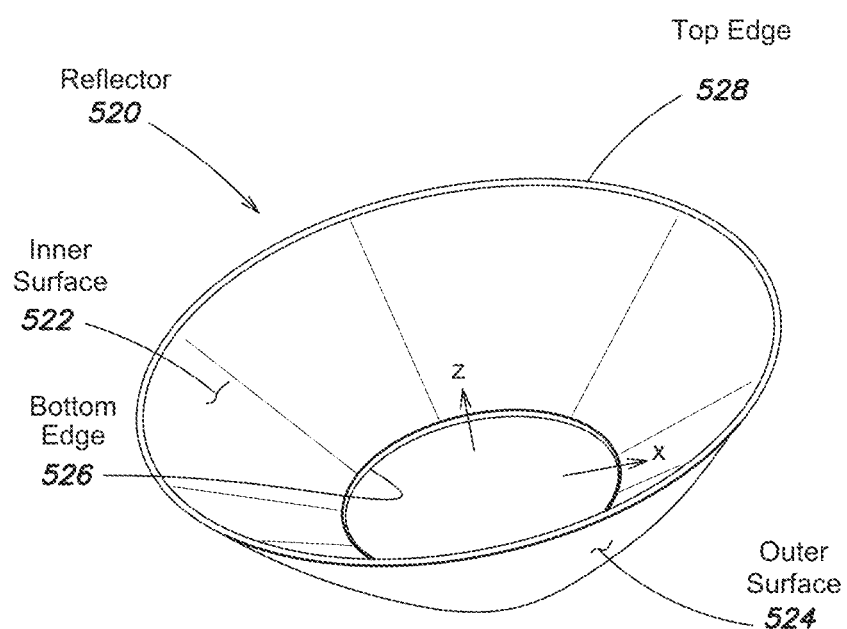
FIG. 5B shows a perspective view of an example reflector configured to be used with the lens shown in FIG. 5A, according to some embodiments of the technology described herein.

The lens 410 and reflector 408 may be constructed in any of variety of ways. An example implementation of the lens 410 and reflector 408 is shown in FIGS. 5A and 5B by lens 500 and reflector 520, respectively. As shown in FIG. 5A, the lens 500 comprises a recess 502, a recess surface 504, a bottom surface 506, a lateral surface 508, a top surface 510, and an inner surface 512.

The recess 502 may be constructed to receive an LED (e.g., LED 402) and/or a scattering element (e.g., scattering element 404). The recess 502 may be deep enough to provide an air gap between the LED and the recess surface 504. The recess surface 504 may be textured to scatter light and, thereby, facilitate mixing of the received light from the LED.

The bottom surface 506 may be in contact with a circuit board (e.g., circuit board 208). For example, the bottom surface 506 may be a flat surface that rests against the circuit board.

The inner surface 512 may be in contact with air. Thereby, the inner surface 512 may not be in contact with potting material (e.g., potting material 212). The inner surface 512 may be configured to reflect light received through the recess surface 504 towards the lateral surface 508 of the lens 500. For example, the inner surface 512 may be constructed such that light received through the recess surface 504 strikes the inner surface 512 at an angle that is greater than the critical angle for total internal reflection (TIR).

The lateral surface 508 may be in contact with air or another media (e.g., a material with a lower refractive index than the lens 500). The lateral surface 508 may be configured to allow light to pass into and out of the lens 500. For example, light may leave a lateral surface 508 and be reflected back into the lens 500 by an inner surface 522 of the reflector 520. Alternatively (or additionally), the lateral surface 508 of the lens may be configured to reflect light towards the top surface 510 of the lens 500. For example, the lateral surface 508 may be constructed such that light strikes the lateral surface 508 at an angle that is greater than the critical angle for TIR.

The lens 500 may be received by the reflector 520, as shown in FIG. 5B, that comprises an inner surface 522, an outer surface 524, a bottom edge 526, and a top edge 528. The top edge 528 and the bottom edge 526 may be proximate the top surface 510 and the bottom surface 506, respectively, of the lens 500 when the lens 500 is placed in the reflector 520. The inner surface 522 may be a reflective surface that reflects light from the lateral surface 508 of the lens 500 back into the lens 500. The inner surface 522 may be configured to provide specular and/or diffusive reflection. For example, a portion of the inner surface 522 may be configured to provide diffusive reflection to enhance mixing of the light to make the color temperature more uniform. The outer surface 524 may be a reflective or non-reflective surface opposite the inner surface 522. The outer surface 524 may (or may not) be in contact with a potting material (e.g., potting material 212) in the lighting system.

Figure 6A:
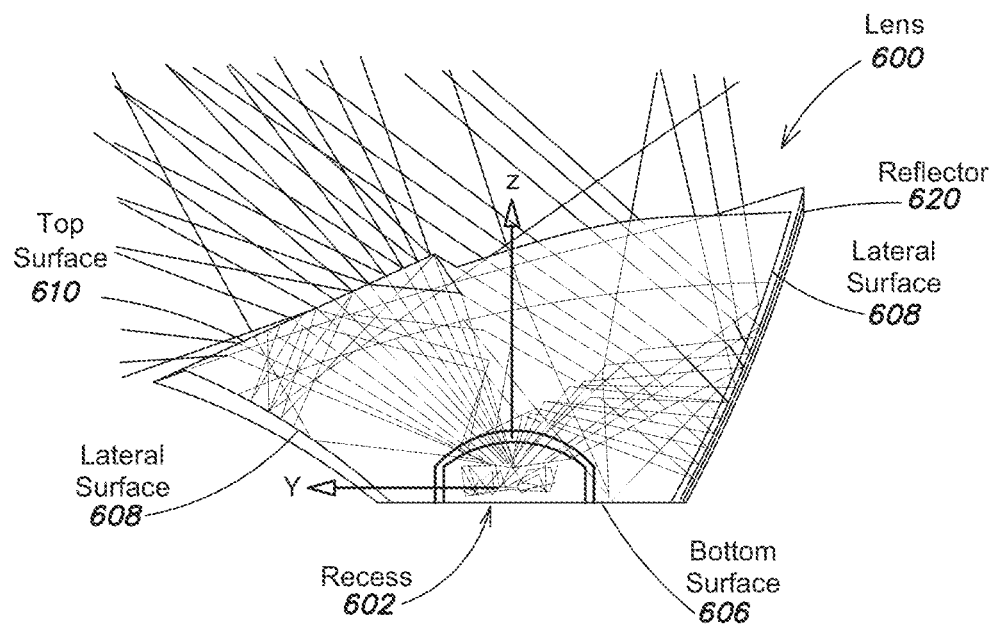
FIG. 6A shows a side view of an example asymmetric lens and reflector assembly, according to some embodiments of the technology described herein.
Figure 6B:
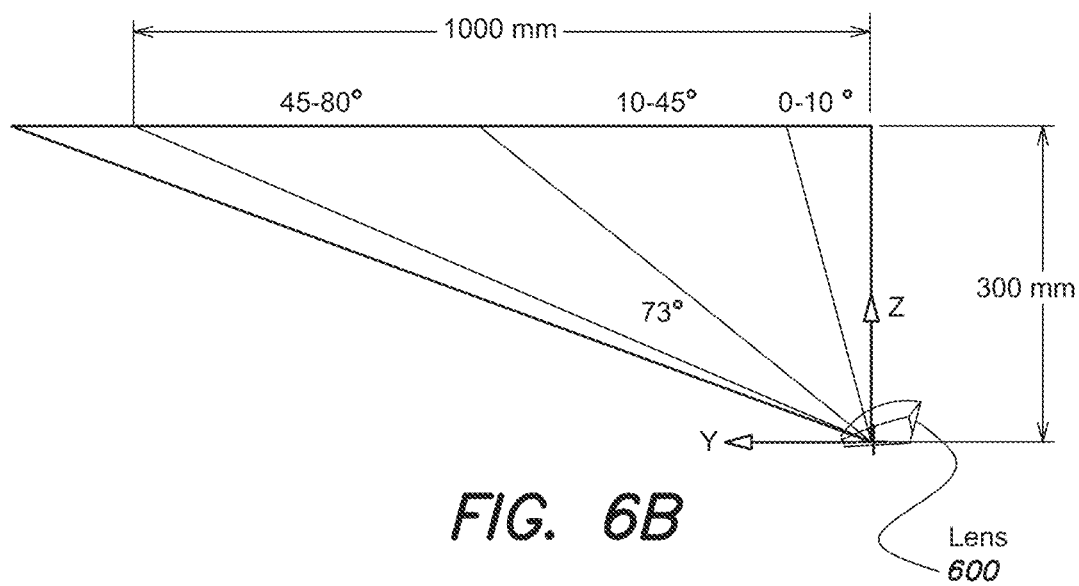
FIG. 6B shows an example light distribution provided by the example asymmetric lens and reflector assembly in FIG. 6A, according to some embodiments of the technology described herein.

It should be appreciated that various alterations may be made to the lens 500 and the reflector 520 without departing from the scope of the present disclosure. The shape of the top surface 510 of the lens 500 and/or the top edge of the reflector 520 may be adjusted to change the distribution of light from the lens 500. For example, the top surface 510 of the lens 500 and/or the top edge of the reflector 520 may be asymmetrical in shape (e.g., elliptical) to form different distributions of light. An example asymmetrical lens and reflector is shown in FIG. 6 by lens 600 in a reflector 620. As shown, the lens 600 has a top surface 610 that is curved to create an asymmetric light distribution, a bottom surface 606 opposite the top surface that may face a circuit board, a recess 602 to receive an LED, a lateral surface 608 that faces the reflector 620. The asymmetric light distribution created by the lens 600 and the reflector 620 in the Z-Y plane is shown in FIG. 6B. As shown, the lens 600 and the reflector 620 provide light at angles ranging from 0 degrees (°) to 80°. Table 1 below shows the relative luminance provided by the lens 600 and the reflector 620 in different regions of the Z-Y plane.

TABLE 1

Relative Luminance for various regions in Z-Y Plane

| Angle on Z-Y Plane | Relative Luminance [%] |
|---|---|
| 0°-10° | 5.0 |
| 10°-45° | 28.4 |
| 45°-80° | 40.1 |
| >80° | 10.0 |
| <0° | 16.6 |

Example Lighting Applications

The lighting devices described above may be employed in any of a variety of lighting applications. FIGS. 8A-8G show various lighting applications that may employ the lighting devices and/or systems described herein such as lighting system 100. The various lighting applications include railway lighting applications, ceiling lighting applications, pathway lighting applications, wall lighting applications, and billboard lighting applications. In each of the lighting applications described below, a lighting device may be mounted to a structure such as a wall, a ceiling, a ledge, a guide rail, or a lighting post using an adhesive. For example, an adhesive backing may be applied to the bottom of the lighting device (e.g., the surface of lighting device 102 shown in FIG. 1B) and the bottom of the lighting device may be pressed against the structure to mount the lighting device. Thereby, the adhesive may hold the lighting device in place on the structure.

Figure 8A:
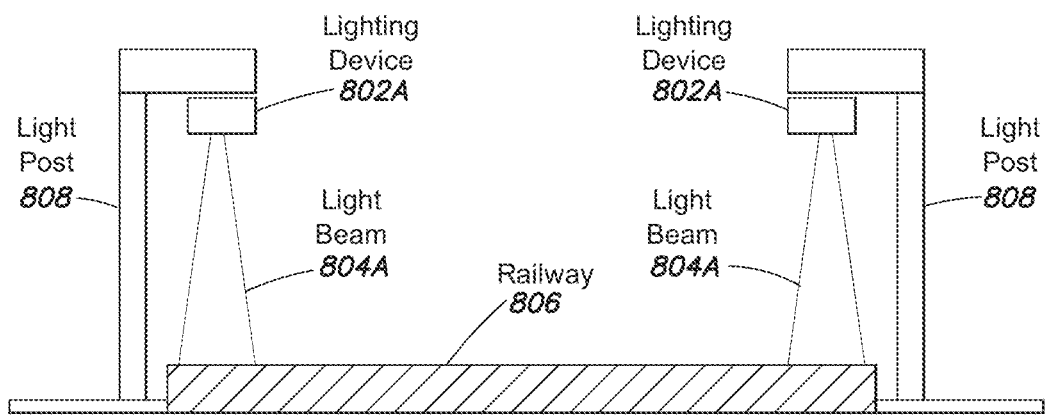
FIG. 8A shows an example lighting system in a railway lighting application, according to some embodiments of the technology described herein.

FIG. 8A shows an example lighting device 802A in a railway lighting application. As shown, the lighting device 802A is disposed over a railway 806 to illuminate the railway 806. The lighting device 802A is mounted to a light post 808 that is proximate the railway 806. The lighting device 802A may be configured to provide a circular or oblong light beam 804A to illuminate the railway 806. For example, the lighting device 802A may employ the lens 500 and/or reflector 520 to create the circular or oblong light beam 804A.

Figure 8B:
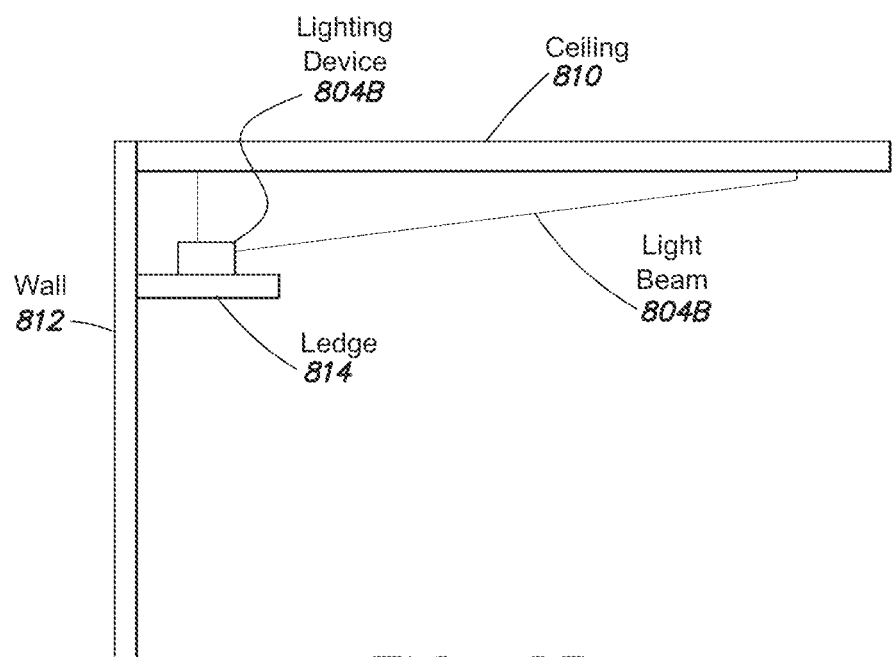
FIG. 8B shows an example lighting system in a ceiling lighting application, according to some embodiments of the technology described herein.

FIG. 8B shows an example lighting device 802B in a ceiling lighting application. As shown, the lighting device 802B may be mounted on a ledge 814 that is attached to a wall 812. The lighting device 802B may be configured to provide an asymmetric light beam 804B that illuminates a ceiling 810. For example, the lighting device 802B may employ the lens 600 and/or reflector 620 to create the asymmetric light beam 804B.

Figure 8C:
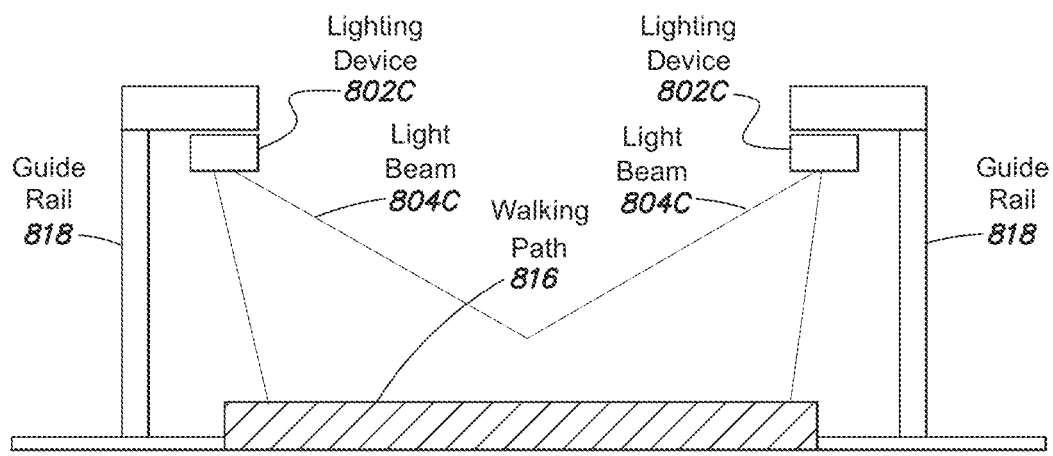
FIG. 8C shows an example lighting system in a pathway lighting application, according to some embodiments of the technology described herein.

FIG. 8C shows an example lighting device 802C in a pathway lighting application. As shown, the lighting device 802C may be mounted to a guide rail 818. The lighting device 802C may be configured to provide an asymmetric light beam 804C that illuminates a walking path 816. For example, the lighting device 802C may employ the lens 600 and/or reflector 620 to create the asymmetric light beam 804C.

Figure 8D:
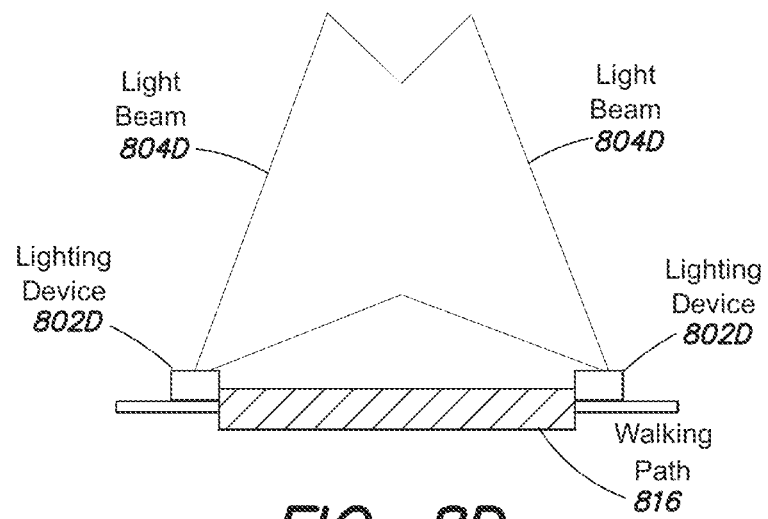
FIG. 8D shows an example lighting system in a pathway lighting application, according to some embodiments of the technology described herein.

FIG. 8D shows an example lighting device 802D in a pathway lighting application. As shown, the lighting device 802D may be mounted on the walking path 816 and/or the ground proximate the walking path 816. The lighting device 802D may be configured to provide an asymmetric light beam 804D that illuminates the walking path 816. For example, the lighting device 802D may employ the lens 600 and/or reflector 620 to create the asymmetric light beam 804D.

Figure 8E:
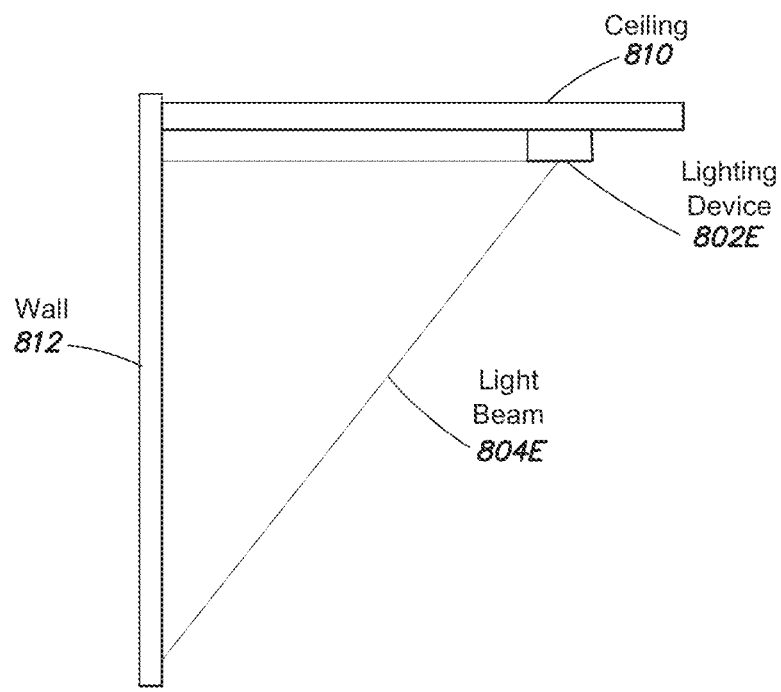
FIG. 8E shows an example lighting system in a wall lighting application, according to some embodiments of the technology described herein.

FIG. 8E shows an example lighting device 802E in a wall lighting application. As shown, the lighting device 802E may be mounted on the ceiling 810. The lighting device 802E may be configured to provide an asymmetric light beam 804E that illuminates a wall 812. For example, the lighting device 802E may employ the lens 600 and/or reflector 620 to create the asymmetric light beam 804E.

Figure 8F:
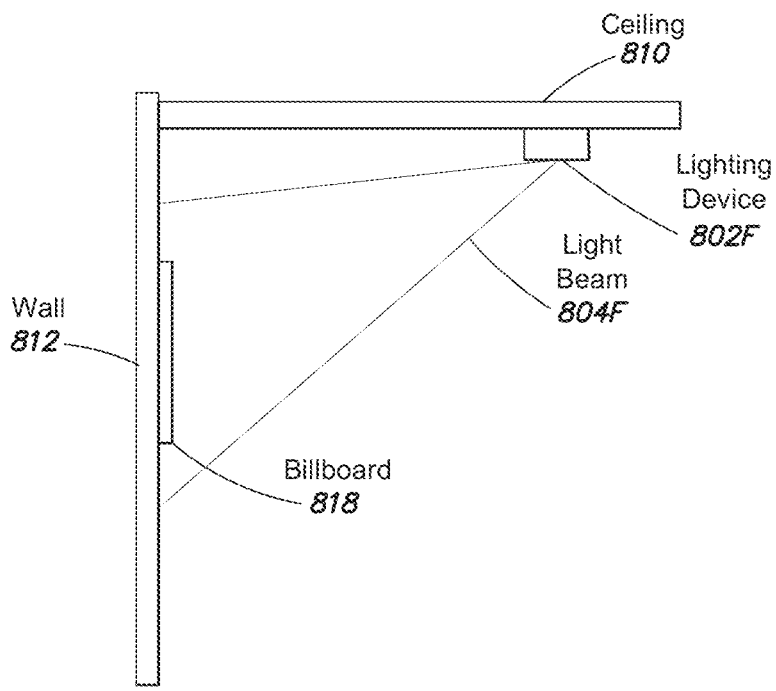
FIG. 8F shows an example lighting system in a billboard lighting application, according to some embodiments of the technology described herein.

FIG. 8F shows an example lighting device 802F in a billboard lighting application. As shown, the lighting device 802F may be mounted on the ceiling 810. The lighting device 802F may be configured to provide an asymmetric light beam 804F that illuminates a billboard 818 on a wall 812. For example, the lighting device 802F may employ the lens 600 and/or reflector 620 to create the asymmetric light beam 804F.

Figure 8G:
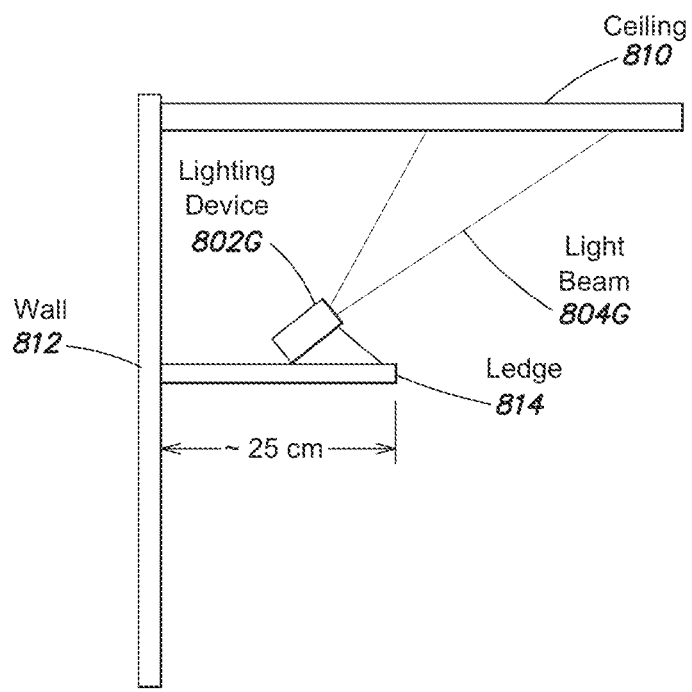
FIG. 8G shows an example lighting system in a ceiling lighting application, according to some embodiments of the technology described herein.

FIG. 8G shows an example lighting device 802G in a ceiling lighting application to create a knife edge lighting effect. As shown, the lighting device 802G may be mounted on a ledge 814. The lighting device 802G may be configured to provide an asymmetric light beam 804G that illuminates the ceiling 810. For example, the lighting device 802G may employ the lens 600 and/or reflector 620 to create the asymmetric light beam 804G.

Various aspects of the present disclosure may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately," "about," and "substantially" may be used to mean within ±20% of a target value in some embodiments, within ±10% of a target value in some embodiments, within ±5% of a target value in some embodiments, and yet within ±2% of a target value in some embodiments. The terms "approximately," "about," and "substantially" may include the target value.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having described above several aspects of at least one embodiment, it is to be appreciated various alterations, modifications, and improvements will readily occur to those skilled in the art. Such alterations, modifications, and improvements are intended to be object of this disclosure. Accordingly, the foregoing description and drawings are by way of example only.

What is claimed is:

1. A lighting system, comprising:
   a lens assembly including a lens having a light output surface being spaced apart along a central axis from a light input surface, the lens further having a lateral surface being spaced apart around the central axis and having a frusto-conical shape extending between the light input and output surfaces of the lens, the lens being configured for causing some light passing into the lens through the light input surface to be diverted toward the lateral surface;
   a light source being located adjacent to the light input surface of the lens, the light source including a semiconductor light-emitting device and being configured for generating light being directed through the light input surface into the lens;
   a reflector having another frusto-conical shape, the reflector surrounding the lens along the central axis extending between the light input and output surfaces of the lens for causing some of the light being diverted toward the lateral surface by the lens to then be diverted by the reflector toward the lens; and
   a light-transmissive elastomeric layer being interposed between the reflector and the lateral surface of the lens, the light-transmissive elastomeric layer having a different refractive index than a refractive index of the lens, for causing some of the light being diverted toward the lateral surface by the lens or by the reflector to then be refracted into the lens thereby reducing an angular correlated color temperature deviation of the light emissions.

2. The lighting system of claim 1, wherein the light-transmissive elastomeric layer has a lower refractive index than the refractive index of the lens, for causing some of the light being diverted toward the lateral surface by the lens or by the reflector to then be refracted into the lens away from an orientation being normal to the light-transmissive elastomeric layer.

3. The lighting system of claim 1, wherein the light source is a phosphor-converted light source.

4. The lighting system of claim 1, wherein the lens has an inner surface forming a frusto-conical cavity extending from the light output surface along the central axis into the lens, the inner surface being for causing some light passing into the lens through the light input surface to be reflected at the inner surface toward the lateral surface of the lens.

5. The lighting system of claim 1, wherein the light input surface has a recess forming a gap between the lens and the light source, for directing the light from the light source through the gap toward the light input surface of the lens.

6. The lighting system of claim 1, wherein the light input surface has a recess forming an air gap between the lens and the light source, for refracting the light from the light source at a boundary between the air gap and the lens toward a direction being normal to the light input surface.

7. The lighting system of claim 1, wherein the light-transmissive elastomeric layer includes silicone or rubber.

8. A lighting process, comprising:
   providing a lighting system having a lens assembly including a lens having a light output surface being spaced apart along a central axis from a light input surface, the lens having a lateral surface being spaced apart around the central axis and having a frusto-conical shape extending between the light input and output surfaces of the lens, the lighting system further having a light source being located adjacent to the light input surface of the lens, the light source including a semiconductor light-emitting device, the lighting system also including a reflector having another frusto-conical shape and surrounding the lens along the central axis extending between the light input and output surfaces of the lens, and the lighting system additionally having a light-transmissive elastomeric layer being interposed between the reflector and the lateral surface of the lens, the light-transmissive elastomeric layer having a different refractive index than a refractive index of the lens;
   causing the light source to generate light being directed through the light input surface into the lens;
   causing the lens to divert, toward the lateral surface, some light after passing into the lens through the light input surface;
   causing the reflector, after the lens causes some of the light to be diverted toward the lateral surface, to then divert some of the diverted light towards the lens; and
   causing the light-transmissive elastomeric layer to refract some of the light, after being diverted toward the lateral surface by the lens or by the reflector, into the lens thereby reducing an angular correlated color temperature deviation of the light emissions.

9. The lighting process of claim 8, wherein providing the lighting system includes providing the light-transmissive elastomeric layer as having a lower refractive index than the refractive index of the lens, and wherein causing the light-transmissive elastomeric layer to refract some of the light after being diverted toward the lateral surface by the lens or by the reflector in the process includes causing the light-transmissive elastomeric layer to refract some of the light into the lens away from an orientation being normal to the light-transmissive elastomeric layer.

10. The lighting process of claim 8, wherein providing the lighting system further includes providing the light source as being a phosphor-converted light source.

11. The lighting process of claim 8, wherein providing the lighting system includes providing the lens as having an inner surface forming a frusto-conical cavity extending from the light output surface along the central axis into the lens, and wherein the process includes the inner surface as causing some light after passing into the lens through the light input surface to then be reflected at the inner surface toward the lateral surface of the lens.

12. The lighting process of claim 8, wherein providing the lighting system includes providing the light input surface as having a recess forming a gap between the lens and the light source, and wherein the process includes causing the light from the light source to be directed through the gap toward the light input surface of the lens.

13. The lighting process of claim 8, wherein providing the lighting system includes providing the light input surface as having a recess forming an air gap between the lens and the light source, and wherein the process includes causing the light from the light source to be refracted, at a boundary between the air gap and the lens, toward a direction being normal to the light input surface.

14. The lighting process of claim 8, wherein providing the lighting system includes providing the light-transmissive elastomeric layer as including silicone or rubber.

\* \* \* \* \*